(12) United States Patent
Takizawa et al.

(10) Patent No.: US 7,963,736 B2
(45) Date of Patent: *Jun. 21, 2011

(54) WAFER PROCESSING APPARATUS WITH WAFER ALIGNMENT DEVICE

(75) Inventors: Masahiro Takizawa, Tokyo (JP);
Masaei Suwada, Tokyo (JP); Masayuki Akagawa, Tokyo (JP)

(73) Assignee: ASM Japan K.K., Tokyo (JP)

( * ) Notice: Subject to any disclaimer, the term of this patent is extended or adjusted under 35 U.S.C. 154(b) by 461 days.

This patent is subject to a terminal disclaimer.

(21) Appl. No.: 12/062,419

(22) Filed: Apr. 3, 2008

(65) Prior Publication Data

US 2009/0252580 A1    Oct. 8, 2009

(51) Int. Cl.
*H01L 21/677* (2006.01)
(52) U.S. Cl. ......................... 414/217; 414/935; 414/936
(58) Field of Classification Search .................. 414/217, 414/935, 936
See application file for complete search history.

(56) References Cited

U.S. PATENT DOCUMENTS

| | | |
|---|---|---|
| 3,907,439 A | 9/1975 | Zanoni |
| 3,945,505 A | 3/1976 | Frisbie et al. |
| 4,024,944 A | 5/1977 | Adams et al. |
| 4,148,344 A | 4/1979 | Critchell et al. |
| 4,201,378 A | 5/1980 | Hams |
| 4,228,886 A | 10/1980 | Moran |
| 4,449,885 A | 5/1984 | Hertel et al. |
| 4,457,664 A | 7/1984 | Judell et al. |
| 4,466,073 A | 8/1984 | Boyan et al. |
| 4,507,078 A | 3/1985 | Tam et al. |
| 4,523,985 A | 6/1985 | Dimock |
| 4,559,451 A * | 12/1985 | Curl .................. 250/559.36 |
| 4,635,373 A | 1/1987 | Miyazaki et al. |
| 4,647,268 A | 3/1987 | Scholl |
| 4,698,511 A | 10/1987 | Sueda et al. |
| 4,705,951 A | 11/1987 | Layman et al. |

(Continued)

FOREIGN PATENT DOCUMENTS

EP    0 282 233 A1    9/1988

(Continued)

OTHER PUBLICATIONS

Deguchi et al., "Alignment accuracy evaluation of x-ray lithography system SR-1," Journal of the Japan Society of Precision Engineering, 1985, vol. 51, No. 5, pp. 156-162.

(Continued)

*Primary Examiner* — Michael S Lowe
(74) *Attorney, Agent, or Firm* — Knobbe Martens Olson & Bear LLP (57) ABSTRACT

A semiconductor-processing apparatus includes: a wafer handling chamber; a wafer processing chamber; a wafer handling device; a first photosensor disposed in the wafer handling chamber in front of the wafer processing chamber at a position where the wafer partially blocks light received by the first photosensor at a ready-to-load position and substantially entirely blocks light received by the first photosensor when the wafer moves from the ready-to-load position toward the wafer processing chamber in the x-axis direction; and a second photosensor disposed in the wafer handling chamber in front of the wafer processing chamber at a position where the wafer does not block light received by the second photosensor at the ready-to-load position and partially blocks light received by the second photosensor when the wafer moves from the ready-to-load position toward the wafer processing chamber in the x-axis direction.

16 Claims, 7 Drawing Sheets

U.S. PATENT DOCUMENTS

| | | | |
|---|---|---|---|
| 4,720,635 A | 1/1988 | Uga | |
| 4,744,713 A | 5/1988 | Hrovath | |
| 4,765,793 A | 8/1988 | Goddeau | |
| 4,770,590 A | 9/1988 | Hugues et al. | |
| 4,789,294 A | 12/1988 | Sato et al. | |
| 4,818,169 A | 4/1989 | Schram et al. | |
| 4,819,167 A | 4/1989 | Cheng et al. | |
| 4,833,790 A | 5/1989 | Spencer et al. | |
| 4,838,733 A | 6/1989 | Katz | |
| 4,880,348 A | 11/1989 | Baker et al. | |
| 4,907,035 A | 3/1990 | Galburt et al. | |
| 5,044,752 A | 9/1991 | Thurfjell et al. | |
| 5,162,642 A | 11/1992 | Akamatsu et al. | |
| 5,194,743 A | 3/1993 | Aoyama et al. | |
| 5,239,182 A | 8/1993 | Tateyama et al. | |
| 5,483,138 A | 1/1996 | Shmookler et al. | |
| 5,563,798 A | 10/1996 | Berken et al. | |
| 5,706,201 A | 1/1998 | Andrews | |
| 5,706,930 A | 1/1998 | Sahoda et al. | |
| 5,740,062 A | 4/1998 | Berken et al. | |
| 5,768,125 A | 6/1998 | Zinger et al. | |
| 5,822,213 A | 10/1998 | Huynh | |
| 5,870,488 A | 2/1999 | Rush et al. | |
| 5,900,737 A | 5/1999 | Graham et al. | |
| 5,905,850 A | 5/1999 | Kaveh | |
| 5,917,601 A | 6/1999 | Shimazaki et al. | |
| 5,980,194 A | 11/1999 | Freerks et al. | |
| 6,198,976 B1 | 3/2001 | Sundar et al. | |
| 6,327,517 B1 | 12/2001 | Sundar | |
| 6,485,248 B1 * | 11/2002 | Taylor, Jr. | 414/672 |
| 6,502,054 B1 | 12/2002 | Mooring et al. | |
| 6,690,986 B1 | 2/2004 | Mitchell et al. | |
| 6,856,863 B1 * | 2/2005 | Sundar | 700/254 |
| 6,996,456 B2 * | 2/2006 | Cordell et al. | 700/258 |
| 7,008,802 B2 | 3/2006 | Lu | |
| 7,039,501 B2 * | 5/2006 | Freeman et al. | 700/258 |
| 7,100,954 B2 * | 9/2006 | Klein et al. | 294/64.3 |
| 7,299,104 B2 * | 11/2007 | Tezuka et al. | 700/112 |
| 7,319,920 B2 * | 1/2008 | Donoso et al. | 700/254 |
| 7,360,981 B2 * | 4/2008 | Weaver | 414/217 |
| 7,572,092 B2 * | 8/2009 | Hofmeister et al. | 414/744.5 |
| 7,607,879 B2 * | 10/2009 | Hall et al. | 414/217 |
| 2002/0098818 A1 * | 7/2002 | Yokogawa et al. | 455/255 |
| 2003/0197563 A1 * | 10/2003 | Nishizono | 330/308 |
| 2004/0240971 A1 * | 12/2004 | Tezuka et al. | 414/217 |
| 2005/0100435 A1 * | 5/2005 | Dickinson | 414/941 |
| 2007/0052646 A1 * | 3/2007 | Ishiguchi | 345/92 |
| 2009/0093906 A1 * | 4/2009 | Takizawa et al. | 700/214 |
| 2010/0003833 A1 | 1/2010 | Tsuji et al. | |

FOREIGN PATENT DOCUMENTS

| | | |
|---|---|---|
| EP | 0 313 466 A2 | 4/1989 |
| EP | 0 597 637 A1 | 5/1994 |
| JP | 58-055270 | 4/1983 |
| JP | 61-087352 | 5/1986 |
| JP | 61-184842 | 8/1986 |
| JP | 61-228639 | 10/1986 |
| JP | 62-073643 | 4/1987 |
| WO | WO 99/52686 | 10/1999 |

OTHER PUBLICATIONS

Petersen et al., "High-performance mass-flow sensor with integrated laminar flow micro-channels," International Conference on Solid State Sensors and Actuators—Digest of Technical Papers, 1985, pp. 361-363.

Wojcik, Zbigniew M., "A method of automatic centering of chips, masks and semiconductor wafers," Electron Technology, 1977, vol. 10, No. 3, pp. 79-96.

ASM Europe, (Advance 400 Course Module 19), Rev. C, Jun. 1999.

Brooks Automation, (Wafer Handling Robot), Solid State Technology, vol. 28, No. 1, Jan. 1985, p. 74.

GCA Corporation, (Wafertrac1006 Advertisement), Solid State Technology, vol. 28, No. 1, Jan. 1985, p. 3.

IBM Technical Disclosure Bulletin, "Automatic mask/wafer alignment system," Sep. 1975, vol. 28, No. 4, pp. 1474-1479.

IBM Technical Disclosure Bulletin, "Vacuum-compatible low contamination wafer-orientor system," Feb. 1986, vol. 28, No. 9, pp. 4056-4058.

IBM Technical Disclosure Bulletin, "No-edge contact wafer orientor," Jan. 1975, vol. 17, No. 8, pp. 2220-2221.

IBM Technical Disclosure Bulletin, "Front wafer registration device for batch process etch end-pint detection system," Oct. 1977, vol. 20, No. 5, pp. 1756-1759.

Keyence Corporation Brochure, "Laser thrubeam photoelectric sensors LX2 series," Date unknown.

* cited by examiner

Detect deviation in the x-axis direction when rotating

FIG. 12A

Detect deviation in the y-axis direction when moving forward

WAFER PROCESSING APPARATUS WITH WAFER ALIGNMENT DEVICE

BACKGROUND OF THE INVENTION

1. Field of the Invention

The present invention generally relates to a wafer-processing apparatus provided with a wafer alignment device, and particularly to a wafer handling device compensating for a deviation of a wafer thereon.

2. Description of the Related Art

In recent years, the number of wafers processed per unit time (=throughput) has become a matter of keen interest in connection with semiconductor manufacturing apparatuses used in the production of semiconductors. To improve the throughput, various ideas have been experimented on semiconductor manufacturing apparatuses, such as increasing the number of wafer processing chambers, providing multiple arms on the wafer handling device, and raising the wafer loading speed of the wafer handling device.

However, one major problem remains unaddressed, which is the deviation of wafers on the wafer handling device caused by higher wafer loading speeds. To be specific, when a wafer is placed in a position deviating from the specified position in the wafer processing chamber, various process problems will occur such as drop in the uniformity of film. Also, the wafer may drop into the wafer storage chamber during the process of returning the wafer to the wafer storage chamber, or the wafer may hit the chamber and get damaged.

A method generally known to solve this problem of wafer deviation is to place one or multiple photosensors at a position or positions forward in the wafer loading destination to measure a period during which light received by the photosensor is blocked, or the number of pulses from the encoder of the handling device, when the wafer handling device loads the wafer to the target destination, and compare the measured value against the pre-registered value corresponding to the correct wafer position, in order to detect a deviation of the wafer position and correct the wafer position.

Also adopted by the method explained above, digital sampling of output signals is a general method used to detect the sensor output while the wafer handling device is operating. Specifically, this is the method whereby signal values are converted into digital values in a chronological order and the converted digital data series is used to obtain the maximum value or minimum value. In recent years, signal sampling and data analysis are conducted using systems such as the EES (Equipment Engineering System).

However, high-speed operation of the wafer handling device is difficult to grasp when such sampling method is used. At the sampling frequency of 100 ms, which is a general sampling frequency used by EES, it is virtually impossible to follow the arm operation of the wafer handling device. If the operating speed of the wafer handling device is dropped to address this problem, the throughput of the semiconductor manufacturing apparatus will drop. If the sampling frequency is raised, on the other hand, the amount of data will increase and a storage device to save the data will become necessary. This will inevitably lead to a higher cost.

Also, deviation in the extending direction of the arm of the wafer handling device cannot be detected from the sensor output alone. To detect a deviation in the arm extending direction, the handling device controller must have a built-in wafer deviation detection part designed exclusively to monitor the operation of the wafer handling device itself and also count the number of pulses from the encoder of the handling device over a period during which light received by the sensor is blocked. Use of such detection part will present issues such as detection accuracy and cost increase.

SUMMARY OF THE INVENTION

According to an embodiment of the present invention aimed at solving at least one of the problems mentioned above, a semiconductor manufacturing apparatus has photosensors positioned forward of and on a side of the wafer placed on the wafer handling device, where the output signal from the forward photosensor is detected while the wafer handling device is stationary, and the output signal from the side photosensor is detected at the time the wafer passes the sensor as the wafer handling device loads the wafer to the processing chamber, and the two detected output signals are compared against the pre-registered signal corresponding to the correct wafer position in order to calculate the amount of deviation of the wafer and correct the deviation amount, thereby allowing the wafer to be loaded to the correct position in the processing chamber.

In an embodiment of the present invention, the photosensor positioned on a side of the wafer is connected to a peak hold circuit capable of storing the maximum amount of light received by the sensor being blocked by the wafer. This way, the speed of the wafer handling device need not be reduced and there is no need, either, for high-speed sampling of photosensor output signals or number of pulses from the handling device. In addition, it is no longer necessary to provide in the handling device controller an exclusive built-in wafer deviation detection part. When all of the above benefits are combined, it becomes feasible to provide a function for detection and correction of wafer deviation in a cost-effective manner.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention. The drawings are oversimplified for illustrative purposes and are not to scale.

DETAILED DESCRIPTION OF THE PREFERRED EMBODIMENT

The present invention will be explained with reference to preferred embodiments and drawings. The preferred embodiments and drawings are not intended to limit the present invention.

In an embodiment, a semiconductor-processing apparatus comprises: (I) a wafer handling chamber; (II) at least one wafer processing chamber, each connected to the wafer handling chamber; (III) a wafer handling device disposed in the wafer handling chamber for loading a wafer in the wafer processing chamber, said wafer handling device comprising an end effector for placing a wafer thereon, said end effector being movable from a ready-to-load position to the wafer processing chamber in an x-axis direction which is a wafer loading direction and in a y-axis which is perpendicular to the x-axis direction on a wafer loading plane; (IV) at least one first photosensor disposed in the wafer handling chamber in front of the wafer processing chamber at a position where the wafer placed on the end effector partially blocks light received by the first photosensor at the ready-to-load position and substantially entirely blocks light received by the first photosensor when the wafer moves from the ready-to-load position toward the wafer processing chamber in the x-axis direction; and (V) at least one second photosensor disposed in the wafer handling chamber in front of the wafer processing chamber at a position where the wafer placed on the end effector does not block light received by the second photosensor at the ready-to-load position and partially blocks light received by the second photosensor when the wafer moves from the ready-to-load position toward the wafer processing chamber in the x-axis direction.

In the above, in an embodiment, the first photosensor may be adapted to output a first signal indicative of quantity of light sensed by the first photosensor at the ready-to-load position, and the second photosensor may be adapted to output a second signal indicative of lowest quantity of light sensed by the second photosensor when the wafer moves from the ready-to-load position toward the wafer processing chamber.

In any of the foregoing embodiments, the semiconductor-processing apparatus may further comprise a control unit which stores a standard first signal and a standard second signal which are indicative of no deviation of the wafer placed on the end effector either in the x-axis direction or the y-axis direction, wherein the control unit receives the first and second signals from the first and second photosensors, and compares the first and second signals with the standard first and second signals to determine a deviation of the wafer on the end effector in the x-axis direction and a deviation of the wafer on the end effector in the y-axis direction. In an embodiment, the control unit may control the wafer handling device based on the determined deviations of the wafer to move the end effector by compensating for the deviations to the wafer processing chamber. In an embodiment, the control unit may include a peak hold circuit for temporarily holding the second signal outputted from the second photosensor. In an embodiment, the first and second signals may be analogue signals. In another embodiment, the signal is composed of 8 bit signals.

In any of the foregoing embodiments, the first photosensor may be disposed in alignment with an x-axis drawn from an axis of the wafer handing device to a center of the wafer processing chamber as viewed above the end effector. In an embodiment, the first and second photosensors may be disposed in the vicinity of the wafer processing chamber.

In any of the foregoing embodiments, the first photosensor may have a shape elongated in the x-axis direction, and the second photosensor may have a shape elongated in the y-axis direction.

In any of the foregoing embodiments, the first photosensor may also function as a sensor for detecting an obstacle in front of the wafer processing chamber.

In any of the foregoing embodiments, the wafer handling device may be adapted to rotate the end effector around an axis of the wafer handling device to position the end effector at the ready-to-load position.

In any of the foregoing embodiments, the at least one wafer processing chamber may be comprised of two or more wafer processing chambers disposed around the wafer handling chamber. In an embodiment, the wafer handling device may comprise double arms, each having an end effector.

In any of the foregoing embodiments, the wafer handling device may further comprise a wafer clumper for clumping the wafer.

In any of the foregoing embodiments, each of the first and second photosensors may be comprised of a light emitter disposed under the end effector in an axial direction of the wafer handling device, and a light sensor disposed above the end effector in the axial direction. In an embodiment, the light sensor may be constituted by a CCD element.

Another aspect relates to a method for transferring a wafer to a wafer processing chamber connected to a wafer handling chamber, comprising: (i) placing a wafer on an end effector of a wafer handling device disposed in the wafer handling chamber; (ii) moving the end effector with the wafer at a ready-to-load position; (iii) detecting a deviation of the wafer from a standard position on the end effector in an x-axis direction which is a wafer loading direction by a first photosensor disposed in the wafer handling chamber in front of the wafer processing chamber at a position where the wafer placed on the end effector partially blocks light received by the first photosensor at the ready-to-load position and substantially entirely blocks light received by the first photosensor when the wafer moves from the ready-to-load position toward the wafer processing chamber in the x-axis direction; (iv) moving the end effector with the wafer from the ready-to-load position to the wafer processing chamber in the x-axis direction; (v) detecting a deviation of the wafer from the standard position on the end effector in a y-axis direction which is perpendicular to the x-axis direction on a wafer loading plane by a second photosensor disposed in the wafer handling chamber in front of the wafer processing chamber at a position where the wafer placed on the end effector does not block light received by the second photosensor at the ready-to-load position and partially blocks light received by the second photosensor when the wafer moves from the ready-to-load position toward the wafer processing chamber in the x-axis direction; and (vi) adjusting the movement of the end effector based on the detected deviations in the x-axis and y-axis directions when loading the wafer in the wafer processing chamber.

In the above, in an embodiment, the first photosensor may output a first signal indicative of quantity of light sensed by the first photosensor at the ready-to-load position in step (iii), and the second photosensor may output a second signal indicative of lowest quantity of light sensed by the second photosensor when the wafer moves from the ready-to-load position toward the wafer processing chamber in step (v).

In any of the foregoing embodiments, step (vi) may comprise receiving the first and second signals from the first and second photosensors, and comparing the first and second signals with standard first and second signals to determine a deviation of the wafer on the end effector in the x-axis direction and a deviation of the wafer on the end effector in the y-axis direction, said standard first signal and a standard second signal being indicative of no deviation of the wafer placed on the end effector either in the x-axis direction or the y-axis direction.

In any of the foregoing embodiments, step (vi) may comprise controlling the wafer handling device based on the determined deviations of the wafer to move the end effector by compensating for the deviations to the wafer processing chamber.

In any of the foregoing embodiments, in step (iii), the deviation may be measured on an x-axis drawn from an axis of the wafer handing device to a center of the wafer processing chamber as viewed above the end effector. In an embodiment, the first and second photosensors may be disposed in the vicinity of the wafer processing chamber. In an embodiment, the deviation may be measured by a peak hold circuit for temporarily holding the second signal outputted from the second photosensor.

In any of the forgoing embodiments, step (ii) may comprise rotating the end effector around an axis of the wafer handling device to position the end effector at the ready-to-load position.

In any of the foregoing embodiments, steps (iii) and (v) may use analogue signals as the first and second signals.

The present invention will be further explained in detail with reference to the drawings which are not intended to limit the present invention.

In the present disclosure where conditions and/or structures are not specified, the skilled artisan in the art can readily provide such conditions and/or structures, in view of the present disclosure, as a matter of routine experimentation.

Figure 1:
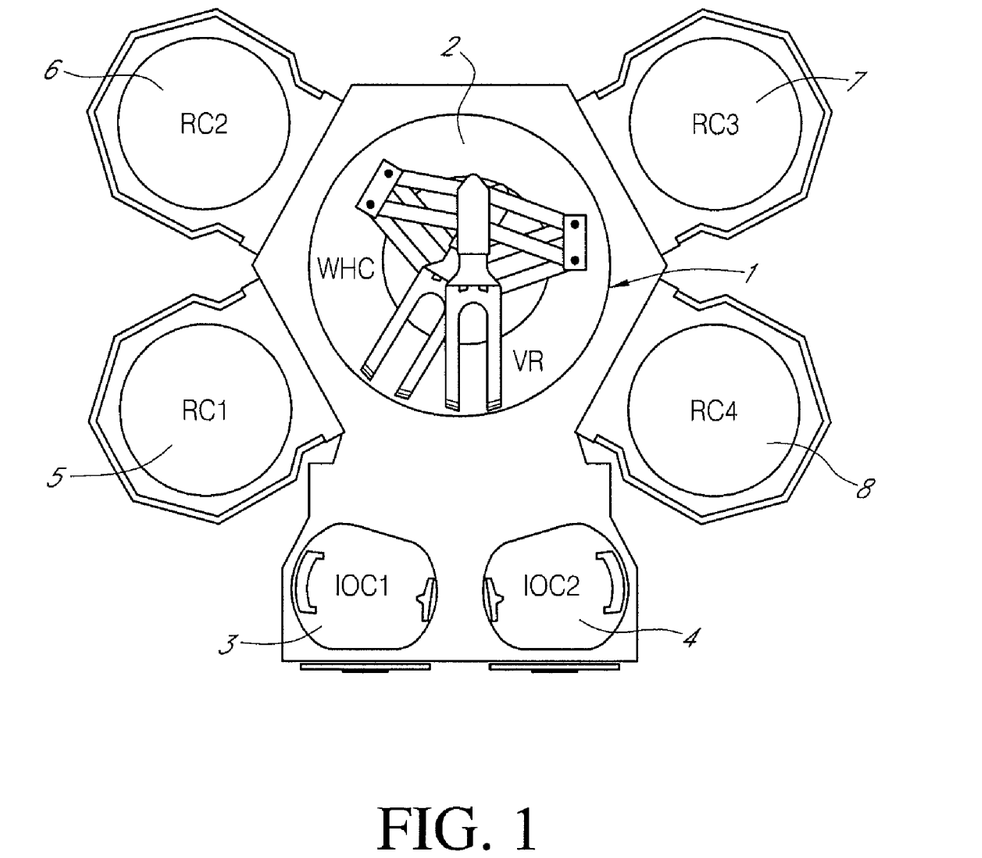
FIG. 1 is a schematic diagram of a semiconductor-processing apparatus comprising four wafer-processing chambers, two wafer-in-and-out chambers, two robot arms, and one wafer-handling chamber usable in an embodiment of the present invention.

FIG. 1 is a schematic diagram showing one example of a conventional semiconductor manufacturing apparatus. This apparatus comprises the separate chambers (modules) listed below:

IOC1, IOC2 (In-Out Chamber): Wafer input/output chambers 3, 4

WHC (Wafer Handling Chamber): Wafer handling chamber 2

RC1, RC2, RC3, RC4 (Reactor Chamber): Wafer processing chambers 5, 6, 7, 8

In FIG. 1, a wafer handling device 1 (Vacuum Robot, or VR) is disposed in the wafer handling chamber 2. This wafer handling device 1 has two arms to improve the throughput. These two arms improve the throughput by, for example, allowing the next wafer to be processed to be carried to the processing chamber simultaneously as the wafer whose processing has completed in the wafer processing chamber is picked up, and thereby causing the new wafer to be placed in the processing chamber by the operation immediately after the operation to pick up the processed wafer, in order to shorten the wafer loading time and thereby improve the throughput.

Figure 2:
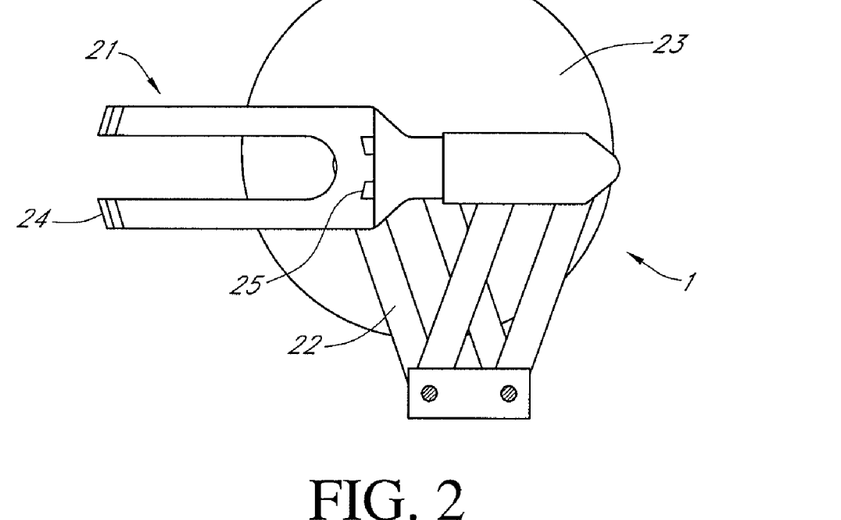
FIG. 2 is a schematic diagram of a wafer handling device usable in an embodiment of the present invention.

Next, the wafer handling device in FIG. 1 is shown in FIG. 2. In FIG. 2, only one arm is illustrated.

The wafer transfer device 1 comprises an end effector 21 rotatably connected to arms 22 having joints. The arms 22 are rotatably connected to a rotatable support 23. The end effector 21 is provided with wafer locators which are protrusions 24 disposed on the front end and protrusions 25 on the rear end. The end effector can be comprised of more than one end effector.

Figure 3:
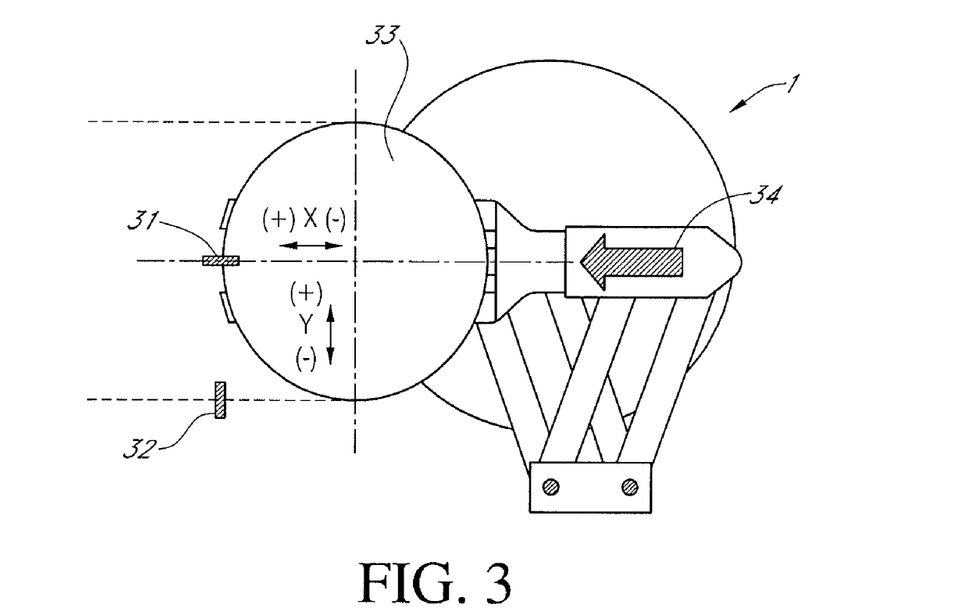
FIG. 3 is a schematic diagram showing a wafer placed on a wafer handling device at a ready-to-load position where the wafer shades a first photosensor according to an embodiment of the present invention.

Next, the wafer handling device 1 in a condition having a wafer 33 on top is shown in FIG. 3. As shown in FIG. 3, when a wafer 33 is placed on the wafer handling device, the tip of the wafer 33 on the wafer handling device blocks light received by a first photosensor 31 placed at the specified position in the wafer handling chamber. Also when the wafer handling device loads the wafer 33 to the wafer processing chamber (not shown) positioned on the left side in FIG. 3, the bottom edge of the wafer 33 as shown in FIG. 3 blocks light received by a second photosensor 32 placed in the position passed by the bottom edge. In other words, the two photosensors should be laid out on the wafer handling chamber in such a way that if the wafer handling device has its wafer placed in the correct position, the left edge of the wafer (in FIG. 3) blocks light received by the first photosensor 31, and when the wafer 33 is loaded to the processing chamber in the X-axis direction indicated by an arrow 34, the bottom edge of the wafer (in FIG. 3) passes the second photosensor 32 and blocks light received by the photosensor (it is also possible to place more than two photosensors depending on the structures of the wafer handling chamber, wafer handling device, and so on). In FIG. 3, the Y-axis is running vertical to the X-axis when the wafer is viewed from the top.

Figure 4:
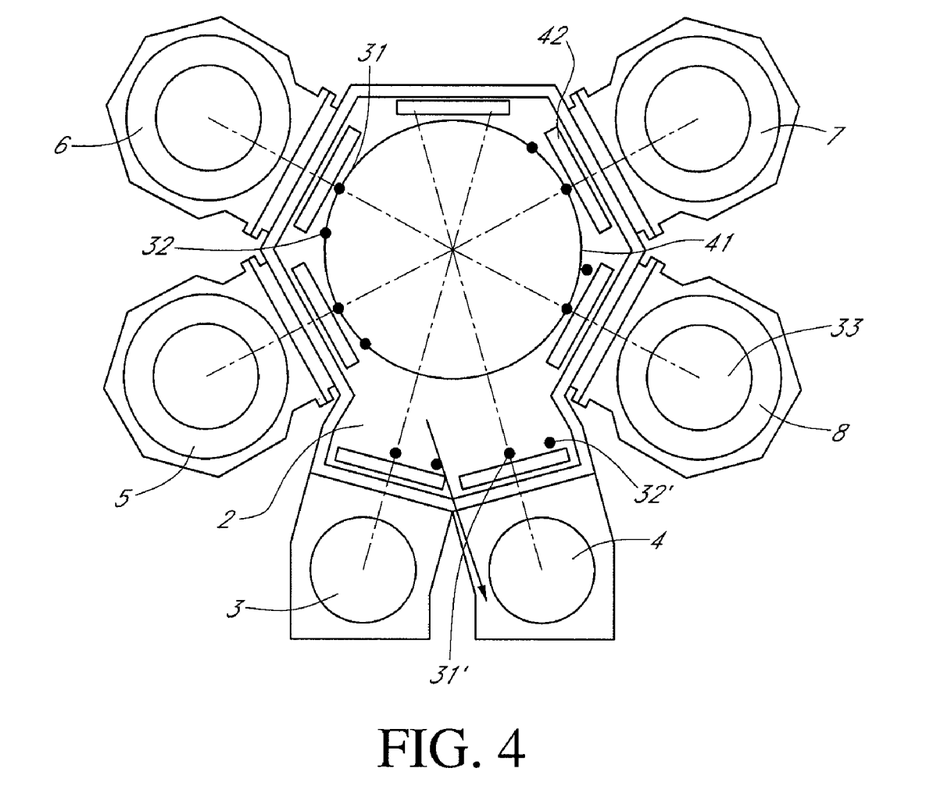
FIG. 4 is a schematic diagram showing positions of photosensors in a wafer handling chamber according to an embodiment of the present invention.

Here, the locations of the photosensors 31, 32 on the wafer handling chamber are indicated by circles in FIG. 4. As shown in FIG. 3 earlier, the first photosensor 31 is positioned along a straight line passing the center of rotation of the wafer handling device, and also at the front face of each wafer processing chamber 5, 6, 7 or 8 or wafer input/output chamber. Since the sensor is positioned at the front face of a gate valve 42 for each processing chamber, this sensor can also be used as an obstacle sensor for the gate valve 42, which contributes to the reduction of number of sensors and realization of a more cost-effective apparatus. Also, as explained in FIG. 3, the second photosensor is positioned where the side edge of the wafer passes the sensor when the wafer handling device loads the wafer to the processing chamber. This sensor is also positioned at the front face of each wafer processing chamber or wafer input/output chamber. While the first photosensor is positioned along a track 41 of the outer periphery edge of the wafer when the handling device turns, the second photosensor need not be positioned along this track 41 (but this sensor can certainly be positioned along this track).

It is sufficient that the second photosensor is positioned where light received by the sensor is not blocked when the handling device has stopped turning and is ready to load the wafer in the X-axis direction into the processing chamber (=loading position), but blocked partially in the process after the start of loading operation and before the wafer is loaded into the processing chamber. In addition, the first photosensor can also be positioned slightly off the X-axis, instead of exactly on the X-axis, as long as the wafer partially blocks light received by the first photosensor at the loading position, while blocking light received by the sensor virtually completely (only for a brief moment) in the process after the start of loading operation and before the wafer is loaded into the processing chamber.

A first photosensor 31' and a second photosensor 32' can also be placed at the front face of the wafer input/output chambers (or load lock chambers) 3, 4 so as to optimize the wafer position inside the input/output chambers.

Figure 5:
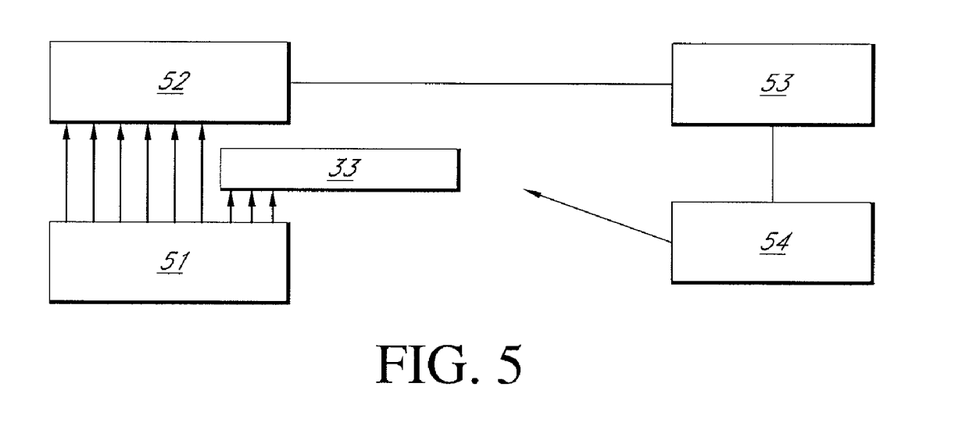
FIG. 5 is a schematic diagram showing a wafer shading a photosensor according to an embodiment of the present invention.

Next, the operating principle of the photosensor is shown in FIG. 5. The photosensor used here comprises a light-emitting part 51 and a light-receiving part 52, which are distanced from each other over a specific dimension. When light received by the sensor is blocked by the wafer 33, the quantity of light changes and this causes the sensor output to change (in an embodiment of the present invention, the wafer position can be detected to the accuracy (repeatability) of approx. 1 micron based on the quantity of light blocked by the wafer). The light-emitting part 51 is a single light source that is preferably a source of semiconductor laser beam (with a wavelength of 670 nm, for example), while the light-receiving part 52 comprises a CCD element and is positioned along a line. Desirably the photosensor may have different dimensions for its width and length, and particularly the light-receiving part 52 may have a longitudinal direction to be able to detect the wafer deviation properly (the light-receiving part 52 and light-emitting part 51 may preferably be provided as a pair and having roughly the same shape). For example, the light-emitting part can have a light-emitting area of 9 mm×3 mm, while the light-receiving part can have an effective light-receiving area of 7 mm×0.085 mm (the aspect ratio of the effective light-receiving area is anywhere from 10 times to 100 times). The light-emitting part 51 is located at the bottom while the light-receiving part 52 is located at the top, because this facilitates the adjustment of the light-receiving sensor position. Photosensors that can be used favorably in an embodiment of the present invention include PBZ-CL007V (laser-type line CCD by Yamatake).

The signal from the light-receiving part 52 is input to a control part 53, where the signal value (reference value) corresponding to the proper wafer position is registered in the control part 53 to allow for comparison between the input signal value and reference value. Based on the comparison result, the control part 53 outputs a control signal indicating the correction amount to a wafer handling device actuator 54 in order to control the wafer handling device and correct the position of the wafer as it is loaded into the processing chamber.

Figure 6:
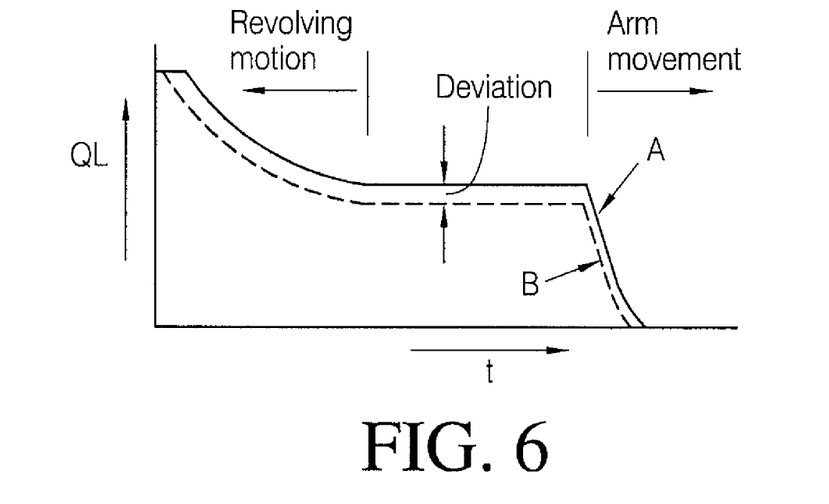
FIG. 6 is a schematic diagram showing a relationship between the movement of a wafer handling device and the output from a first photosensor according to an embodiment of the present invention.
Figure 7:
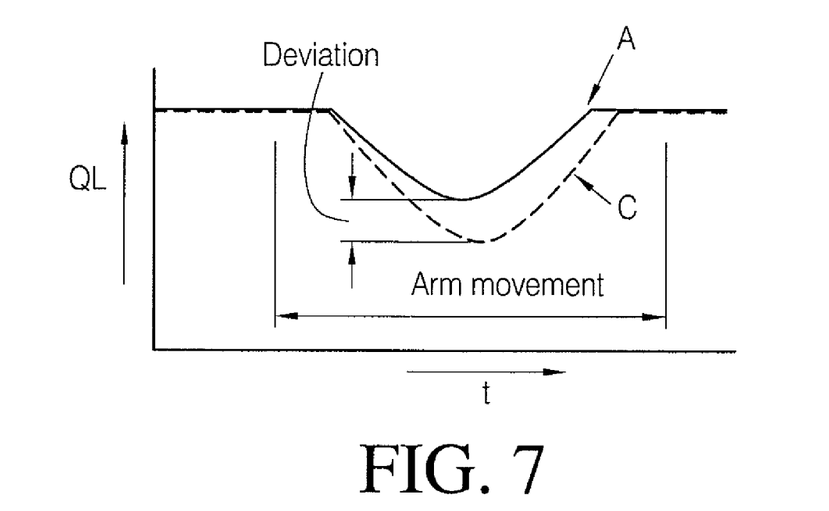
FIG. 7 is a schematic diagram showing a relationship between the movement of a wafer handling device and the output from a second photosensor according to an embodiment of the present invention.
Figure 12A:
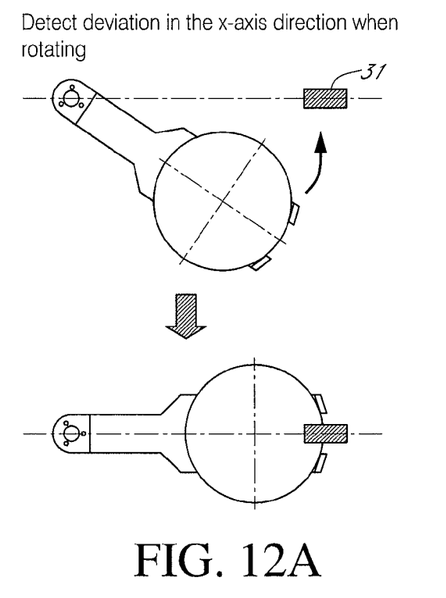
FIGS. 12A and 12B are schematic diagrams showing a wafer shading first and second photosensors according to an embodiment of the present invention.
Figure 12B:
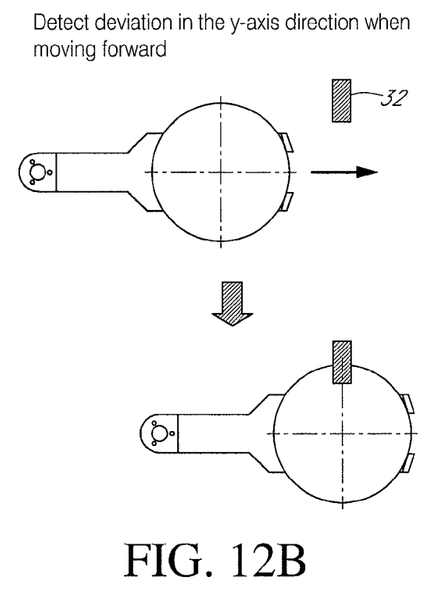

Next, the actual operation of the wafer handling device and how a wafer deviation is detected and corrected are explained specifically. First, an example of wafer deviation detection is explained by referring to FIGS. 3, 12A and 12B. After picking up the wafer 33 from the wafer input/output chamber, the wafer handling device turns and moves the wafer to just in front of the target wafer processing chamber (=ready-to-load position) (FIG. 12(*a*)). When the wafer handling device and wafer become stationary in front of the target wafer processing chamber, the output of the first photosensor 31 is detected. This detected output reveals the wafer position in the X-axis direction according to FIG. 3. Next, the output of the second photosensor 32 is detected when the wafer is moved straight into the target wafer processing chamber from the ready-to-load position, as shown in FIG. 12(*b*). This detected output reveals the wafer position in the Y-axis direction according to FIG. 3. FIGS. 6 and 7 show the mechanisms of detection of X-axis and Y-axis wafer positions, respectively.

FIG. 6 is a schematic diagram showing how the output of the first photosensor 31 changes relative to the operation time of the wafer handling device. The horizontal axis indicates time (t), while the vertical axis indicates the quantity of light (QL) received by the sensor. On the left side of FIG. 6, the wafer handling device turns and gradually approaches the target wafer processing chamber, and as a result light received by the first photosensor 31 is gradually blocked and the quantity of light decreases. At around the center of FIG. 6, the wafer handling device completes its turning and becomes stationary for a while. Thereafter, light received by the first photosensor 31 is completely blocked by the wafer when the wafer is loaded into the target wafer processing chamber, and accordingly the quantity of light becomes zero. This happens on the right side of FIG. 6.

Here, FIG. 6 shows two lines indicating changes in quantity of light, including solid line A and dotted line B. Solid line A represents the change in quantity of light when the wafer is positioned correctly on the wafer handling device, while dotted line B represents the change in quantity of light when the wafer is deviated on the wafer handling device. The difference between these two quantities of light provides an amount indicating the degree of deviation of the wafer from the correct position. In an embodiment of the present invention, the difference between the two quantities of light obtained when the wafer handling device has stopped turning and is stationary for a while in front of the target wafer processing chamber is given as the amount of deviation. Also, the quantity of light when the wafer is positioned correctly on the wafer handling device needs to be registered in the device controller 53 beforehand, and the registered value is compared against the actual sensor output (quantity of light) to detect the amount of wafer deviation. In FIG. 6 the wafer is deviated in the direction of blocking light received by the photosensor more. Needless to say, the wafer can also be deviated in the opposite direction, in which case the dotted line will run above solid line A in FIG. 6.

Next, how the output of the second photosensor 32 changes relative to the operation time of the wafer handling device is shown in FIG. 7 in the same manner as in FIG. 6. On the left side of FIG. 7, the side edge of the wafer gradually blocks light received by the second photosensor 32, and at around the center of FIG. 7 the wafer blocks light received by the second photosensor 32 maximally. Thereafter, the quantity of light received by the sensor increases as the wafer moves away from the sensor. This happens on the right side of FIG. 7.

Here, too, two changes in quantity of light are shown by solid line A and dotted line C in a manner similar to the explanation given for FIG. 6. Solid line A represents the change in quantity of light when the wafer is positioned correctly on the wafer handling device, while dotted line C represents the change in quantity of light when the wafer is deviated on the wafer handling device. The difference between the two quantities of light when the wafer is blocking light received by the second photosensor 32 maximally provides the amount of wafer deviation. The method to detect the maximum blocked quantity of light while the wafer handling device is operating at high speed will be explained later. As is the case in FIG. 6, the quantity of light when the wafer is positioned correctly on the wafer handling device needs to be registered in the device controller 53 beforehand, and the registered value is compared against the actual sensor output (quantity of light) to detect the amount of wafer deviation. Again, in FIG. 7 the wafer is also deviated in the direction of blocking light received by the photosensor more. Needless to say, the wafer can also be deviated in the opposite direction, in which case the dotted line will run above solid line A in FIG. 7.

Figure 10:
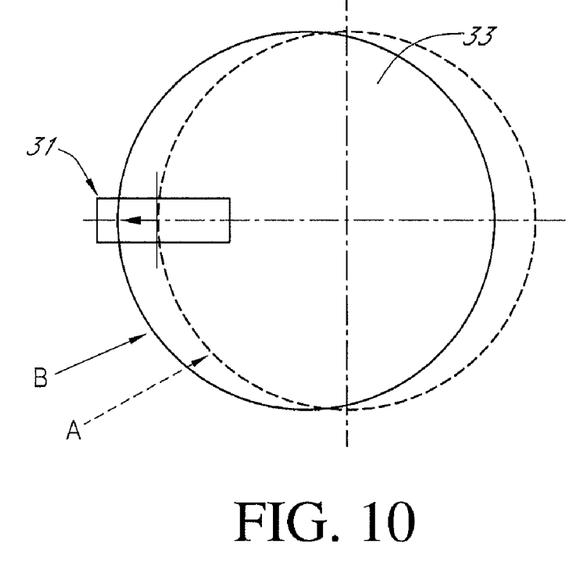
FIG. 10 is a schematic diagram showing a misaligned wafer shading a first photosensor according to an embodiment of the present invention.
Figure 11:
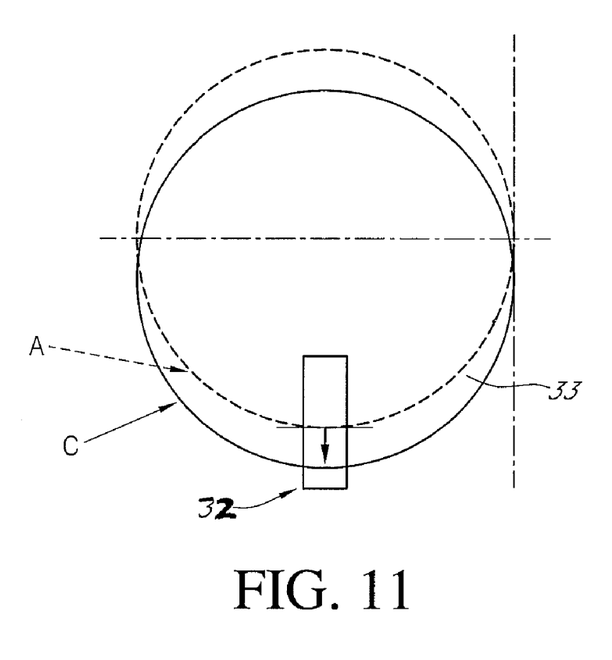
FIG. 11 is a schematic diagram showing a misaligned wafer shading a second photosensor according to an embodiment of the present invention.

To clearly explain the operating principle described above, FIGS. 10 and 11 illustrate the position relationships of the wafer handling device and photosensor in the conditions of wafer deviation illustrated in FIGS. 6 and 7, respectively. To be specific, when the wafer 33 is at its correct position A in FIG. 10, the wafer tip is located near the center of the photosensor 31. When the wafer position is displaced in the X-axis direction (to position B), on the other hand, light received by the photosensor is blocked more. In FIG. 11, when the wafer 33 is at its correct position A, the wafer tip is located near the center of the photosensor 32. When the wafer position is displaced in the Y-axis direction (to position C), on the other hand, light received by the photosensor is blocked more. Therefore, as shown in FIGS. 6 and 7 the quantity of light received by the light-receiving-side sensor will decrease. Needless to say, the wafer may also be deviated in the direction of increasing the quantity of received light (=in the direction opposite to the direction of deviation shown in FIGS. 10 and 11), as explained above.

Figure 8:
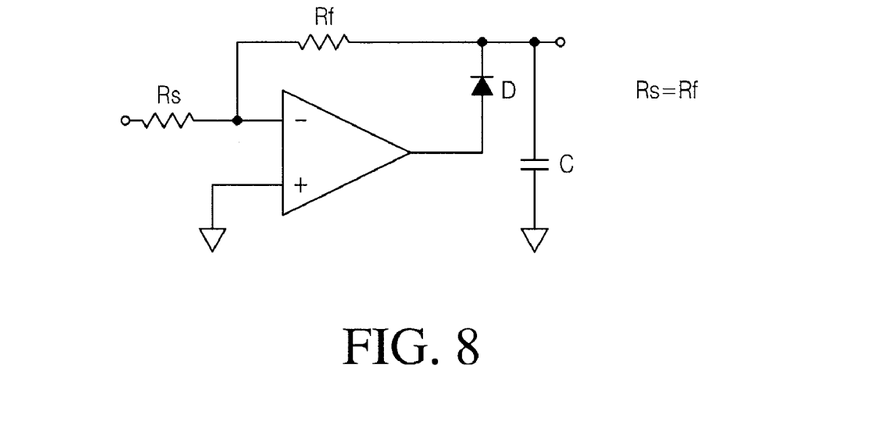
FIG. 8 is a schematic diagram showing a peak hold circuit used in a second photosensor according to an embodiment of the present invention.

Next, an example of the method to detect the maximum blocked quantity of light mentioned in connection with FIG. 7 is explained. The sensor output is input to the circuit shown in FIG. 8. As the output voltage drops, the direction of electrical current is reversed and capacitor C is charged. Next, think of when the output voltage rises over the maximum blocked quantity of light, which corresponds to the condition shown on the right side of FIG. 7. In this condition, electrical charges do not flow backward because of diode D and therefore the amount of electrical charges held by capacitor C remains the same as value achieved at the time of maximum blocking of light. In other words, what is shown in FIG. 8 is a general peak hold circuit. This circuit is only one example and any other circuit may be used without limitation as long as the circuit is able to achieve a similar purpose.

Compared to the aforementioned method of converting the sensor output signals into digital signals and sampling the converted signals, this method of holding only the output value corresponding to the maximally blocked state using a peak hold circuit like the one shown in FIG. 8 allows only the necessary output value to be obtained in a reliable and more cost-effective manner.

Figure 9:
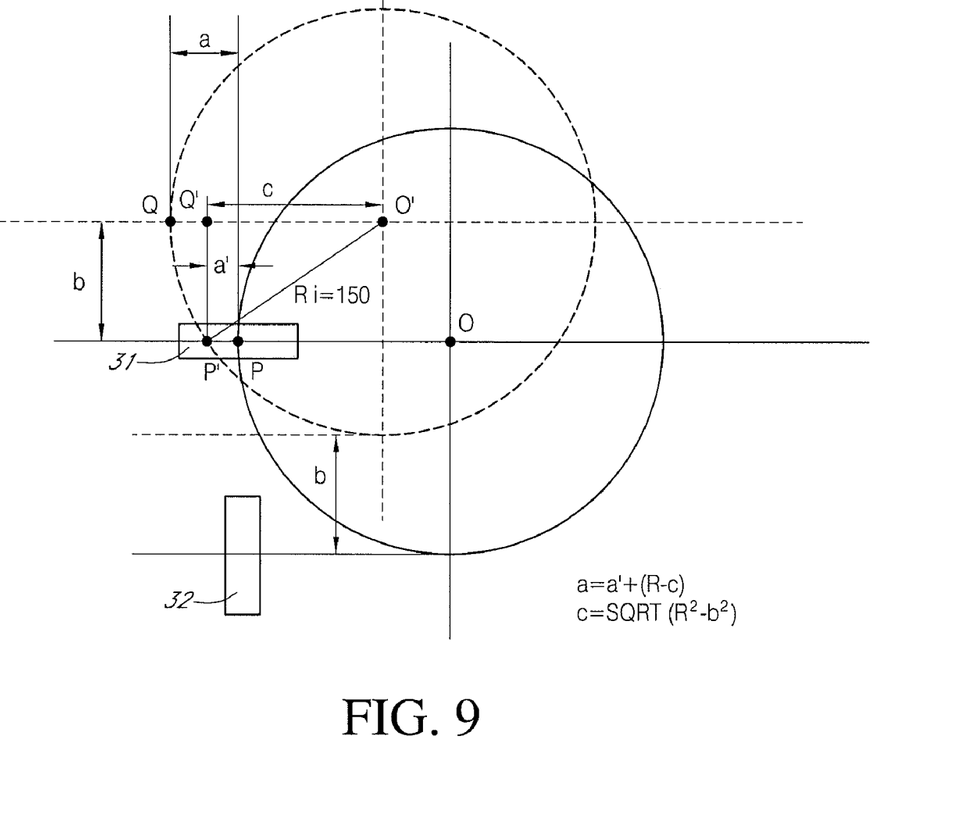
FIG. 9 is a schematic diagram showing a method of calculating a deviation on an x-axis based on sensor outputs for a misaligned wafer and an aligned wafer at a standard position according to an embodiment of the present invention.

Here, the operations to correct a wafer deviation, as illustrated in FIGS. 6 and 7, are summarized and explained again by referring to FIG. 9. In an embodiment of the present invention, general operations are as follows:

1) After the wafer handling device has turned, the first photosensor 31 detects the amount of deviation a' in the X-axis direction. Since the wafer is also deviated in the Y-axis direction in addition to the X-axis direction, the position P' detected by the first photosensor 31 represents the position of the wafer overlapping with the first photosensor 31, instead of the frontmost edge of the wafer, and therefore the distance between positions P and P' does not directly provide the deviation in the X-axis direction. The actual deviation in the X-axis direction is given by the distance a between the frontmost edge Q of the deviated wafer (whose center is at O') and the frontmost edge P of the wafer at an appropriate position (whose center is at O) (=sum of the distance between P' and P and distance between Q' and Q). Here, a can be calculated as explained below.

2) Register a' in the storage area of the device controller.

3) The wafer handling device starts loading the wafer to the wafer processing chamber.

4) Use the second photosensor 32 and peak hold circuit to detect the maximum quantity of light blocked by the wafer to detect the amount of deviation b in the Y direction. (For your information, this deviation is magnified for the purpose of illustration and although the second photosensor 32 is deviating from the bottom edge of the wafer in FIG. 9, the wafer is on the second photosensor 32 and blocking light received by the sensor.)

5) Register b in the storage area of the device controller.

6) Read the detected amount of X-axis deviation a' and detected amount of Y-axis deviation b from the storage area and calculate the actual amount of X-axis deviation a using the device controller based on the formula below (R represents the wafer radius):

$$a = a' + (R - SQRT(R^2 - b^2)) \qquad (1)$$

7) Correct the amount of X-axis deviation a using the arm axis of the wafer handling device in the wafer processing chamber.

8) Correct the amount of Y-axis deviation b using the rotating axis of the wafer handling device in the wafer processing chamber.

9) Complete the wafer loading via the Z-axis operation (downward operation) of the wafer handling device.

The calculation of the actual amount of X-axis deviation mentioned above (formula (1)) is explained further by referring to FIG. 9. In FIG. 9 the solid line represents the correct wafer position and the dotted line represents the deviated wafer position. The wafer position shown by the dotted line in the figure is deviated so much that the wafer is not on the sensor at all. In this condition, detection of deviation is impossible in reality. Here, the condition is intentionally magnified for visual illustration purposes.

First, the distance a' between the X-axis position P of the correctly positioned wafer on the first sensor 31 and the X-axis position P' of the deviated wafer on the first sensor 31 provides the detected amount of deviation in the X-axis direction. Next, the distance b between the Y-axis position of the correctly positioned wafer on the second sensor 32 and the Y-axis position of the deviated wafer on the second sensor 32 provides the detected amount of deviation in the Y-axis direction (as explained earlier, while the deviated wafer is not on the second sensor in FIG. 9, the explanation here assumes that the Y-axis position has been detected). Now, if the position of the tip of the deviated wafer along the X-axis is given as Q, then the actual amount of X-axis deviation of the wafer is given by the distance a between P and Q along the X-axis. To obtain this a, the distance c between the point Q' where the line extending from the point P' crosses with the X-axis at right angles, and the origin O' of the deviated wafer needs to be obtained. Here, however, the distance c is one side O'Q' of the triangle O'P'Q'. Also, the side O'P' represents the radius R of the wafer (if the wafer size is 300 mm, R=150 mm), while the side P'Q' indicates the amount of deviation b in the Y-axis direction. Since the angle formed by the sides P'Q' and O'Q' is 90 degrees, the side O'Q' or distance c can be obtained using the Pythagorean theorem. To be specific, the Pythagorean theorem provides the following relationship:

$$(O'Q')^2 + (P'Q')^2 = (O'P')^2 \quad (2)$$

Since O'Q'=c, P'Q'=b, and O'P'=R, the following relationship holds water:

$$c = SQRT(R^2 - b^2) \quad (3)$$

In formula (3), SQRT is a square root.

Now that c was obtained, the following relationship from FIG. 9 can be utilized:

$$a = a' + (R - c) \quad (4)$$

As a result, the following relationship holds water:

$$a = a' + (R - SQRT(R^2 - b^2))$$

Finally, formula (1) is derived.

Figure 13:
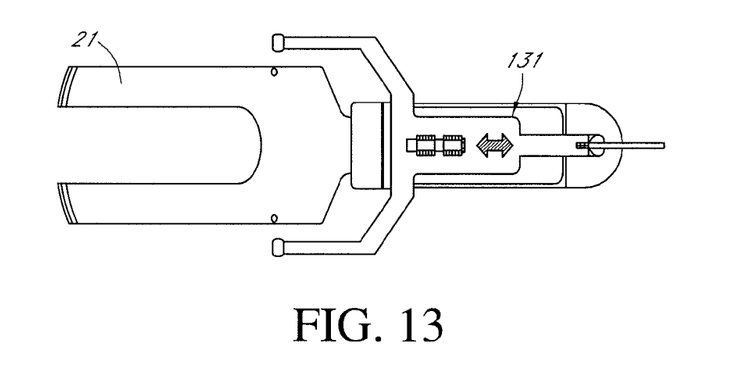
FIG. 13 is a schematic diagram showing an end effector equipped with a wafer clumper according to an embodiment of the present invention.

Under the present invention the wafer handling device may or may not have a wafer clamper attached to the handling device in order to achieve the detection and correction of wafer deviation explained above. As shown in FIG. 13, if a wafer clamper 131 is attached to the handling device, then the present method can be used to detect and correct a wafer deviation in the arm extending direction resulting from the thermal expansion of the arm of the wafer handling device due to the heat released from the wafer.

Based on the foregoing, an embodiment of the present invention provides a semiconductor manufacturing apparatus capable of detecting a wafer deviation and correcting the wafer position, where specifically a deviation of the wafer on the wafer handling device can be detected and corrected. By connecting a peak hold circuit to a photosensor, a function to detect and correct a wafer deviation can be realized in a cost-effective manner.

The present invention includes the above mentioned embodiments and other various embodiments including the following:

1) A semiconductor manufacturing apparatus comprising a semiconductor wafer handling chamber, a semiconductor wafer processing chamber and a semiconductor wafer handling device, wherein such semiconductor manufacturing apparatus is characterized in that the semiconductor wafer handling chamber has at least two photosensors at specified positions and when the semiconductor wafer handling device places a wafer, the wafer blocks light received by a first photosensor, and when the wafer handling device loads the wafer to the semiconductor wafer processing chamber, the wafer blocks light received by a second photosensor, and the second photosensor is connected to an electrical circuit capable of storing the maximum blocked quantity of light for a specified period, so that the blocked quantity of light of the first photosensor and maximum blocked quantity of light of the second photosensor are compared against the pre-registered blocked quantity of light corresponding to the correct wafer position, in order to detect whether or not the wafer is placed in the correct position in the wafer handling device, calculate the correct wafer position from the blocked quantities of light of the photosensors, and as a result the semiconductor wafer handling device can load the wafer to the calculated correct position inside the semiconductor processing apparatus.

2) A semiconductor manufacturing apparatus according to 1) above, characterized in that the electrical circuit is a peak hold circuit.

3) A semiconductor manufacturing apparatus according to 1) above, characterized in that the first photosensor capable of detecting whether or not the wafer is placed in the correct position can also serve as an photosensor for other purpose to reduce the number of sensors and thereby allow for realization of the apparatus in a cost-effective manner.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A semiconductor-processing apparatus comprising:
   a wafer handling chamber;
   at least one wafer processing chamber, each connected to the wafer handling chamber;
   a wafer handling device disposed in the wafer handling chamber for loading a wafer in the wafer processing chamber, said wafer handling device comprising an end effector for placing a wafer thereon, said end effector being movable from a ready-to-load position to the wafer processing chamber in an x-axis direction which is a wafer loading direction and in a y-axis which is perpendicular to the x-axis direction on a wafer loading plane;
   at least one first photosensor disposed in the wafer handling chamber in front of the wafer processing chamber at a position where the wafer placed on the end effector partially blocks light received by the first photosensor at the ready-to-load position and entirely blocks light received by the first photosensor when the wafer moves from the ready-to-load position toward the wafer processing chamber in the x-axis direction; and
   at least one second photosensor disposed in the wafer handling chamber in front of the wafer processing chamber at a position where the wafer placed on the end effector does not block light received by the second photosensor at the ready-to-load position and partially blocks but never entirely blocks light received by the second photosensor when the wafer moves from the ready-to-load position toward the wafer processing chamber in the x-axis direction,
   wherein the first photosensor is adapted to output a first analogue signal indicative of quantity of light sensed by the first photosensor at the ready-to-load position, and the second photosensor is adapted to output a second analogue signal indicative of lowest quantity of light sensed by the second photosensor when the wafer moves from the ready-to-load position toward the wafer processing chamber,
   wherein the first and second photosensors are disposed at positions such that an amount of a wafer deviation, a, in the x-axis direction is determinable by the equation $$a = a' + (R - \sqrt{(R^2 - b^2)})$$

wherein a' is an amount of a wafer deviation detected by the first photosensor, b is an amount of a wafer deviation detected by the second photosensor, and R is a radius of the wafer.

2. The semiconductor-processing apparatus according to claim 1, further comprising a control unit which stores a standard first signal and a standard second signal which are indicative of no deviation of the wafer placed on the end effector either in the x-axis direction or the y-axis direction, wherein the control unit receives the first and second signals from the first and second photosensors, and compares the first and second signals with the standard first and second signals to determine a deviation of the wafer on the end effector in the x-axis direction and a deviation of the wafer on the end effector in the y-axis direction.

3. The semiconductor-processing apparatus according to claim 2, wherein the control unit controls the wafer handling device based on the determined deviations of the wafer to move the end effector by compensating for the deviations to the wafer processing chamber.

4. The semiconductor-processing apparatus according to claim 1, wherein the first photosensor is disposed in alignment with an x-axis drawn from an axis of the wafer handling device to a center of the wafer processing chamber as viewed above the end effector, and the second photosensor is disposed next to the first photosensor along a track of an outer periphery edge of the wafer when the wafer handling device turns.

5. The semiconductor-processing apparatus according to claim 4, wherein the first and second photosensors are disposed in the vicinity of the wafer processing chamber.

6. The semiconductor-processing apparatus according to claim 1, wherein the first photosensor has a shape elongated in the x-axis direction.

7. The semiconductor-processing apparatus according to claim 1, wherein the second photosensor has a shape elongated in the y-axis direction.

8. The semiconductor-processing apparatus according to claim 1, wherein the first photosensor functions also as a sensor for detecting an obstacle in front of the wafer processing chamber.

9. The semiconductor-processing apparatus according to claim 1, wherein the wafer handling device is adapted to rotate the end effector around an axis of the wafer handling device to position the end effector at the ready-to-load position.

10. The semiconductor-processing apparatus according to claim 1, wherein the at least one wafer processing chamber is comprised of two or more wafer processing chambers disposed around the wafer handling chamber.

11. The semiconductor-processing apparatus according to claim 10, wherein the wafer handling device comprises double arms, each having an end effector.

12. The semiconductor-processing apparatus according to claim 1, wherein the wafer handling device further comprises a wafer clumper for clumping the wafer.

13. The semiconductor-processing apparatus according to claim 1, wherein each of the first and second photosensors is comprised of a light emitter disposed under the end effector in an axial direction of the wafer handling device, and a light sensor disposed above the end effector in the axial direction.

14. The semiconductor-processing apparatus according to claim 13, wherein the light sensor is constituted by a CCD element.

15. The semiconductor-processing apparatus according to claim 1, wherein the first and second photosensors are the only photosensors used for detecting the deviations in the x-axis and y-axis directions for each wafer processing chamber.

16. The semiconductor-processing apparatus according to claim 1, wherein the second photosensor is connected to a peak hold circuit designed for temporarily holding the second signal which is a signal of lowest quantity of light outputted from the second photosensor.

* * * * *